(12) United States Patent
Botma et al.

(10) Patent No.: US 8,576,373 B2
(45) Date of Patent: Nov. 5, 2013

(54) LITHOGRAPHIC APPARATUS AND METHOD

(75) Inventors: Hako Botma, Eindhoven (NL); Johannes Aldegonda Theodorus Marie Van Den Homberg, Nederweert (NL)

(73) Assignee: ASML Netherlands B.V., Veldhoven (NL)

( * ) Notice: Subject to any disclaimer, the term of this patent is extended or adjusted under 35 U.S.C. 154(b) by 521 days.

(21) Appl. No.: 12/893,577

(22) Filed: Sep. 29, 2010

(65) Prior Publication Data
US 2011/0149255 A1    Jun. 23, 2011

Related U.S. Application Data

(60) Provisional application No. 61/287,849, filed on Dec. 18, 2009.

(51) Int. Cl.
*G03B 27/52* (2006.01)
*G03B 27/54* (2006.01)
*G03B 27/72* (2006.01)

(52) U.S. Cl.
USPC .................................. 355/30; 355/67; 355/71

(58) Field of Classification Search
USPC ............ 355/30, 53; 250/338.1, 338.3, 338.4; 438/49
See application file for complete search history.

(56) References Cited

U.S. PATENT DOCUMENTS

2003/0071215 A1* 4/2003 Ajisawa ..................... 250/338.1
2006/0063291 A1* 3/2006 Shin et al. ...................... 438/49

* cited by examiner

*Primary Examiner* — Peter B Kim
(74) *Attorney, Agent, or Firm* — Sterne, Kessler, Goldstein & Fox P.L.L.C.

(57) ABSTRACT

A lithographic apparatus is provided with a sensor. The sensor comprises a frame that defines a space that is crossed multiple times by wire. Detection electronics are connected to the wire and configured to detect a change of temperature of the wire due to infrared radiation being incident upon the wire. The detection electronics are further configured to provide an output signal in the event that a change of temperature of the wire is detected.

13 Claims, 3 Drawing Sheets

LITHOGRAPHIC APPARATUS AND METHOD

CROSS REFERENCE TO RELATED APPLICATIONS

This application claims benefit under 35 U.S.C. §119(e) to U.S. Provisional Patent Application No. 61/287,849, filed Dec. 18, 2009, which is incorporated by reference herein in its entirety.

BACKGROUND

1. Field of the Invention

The present invention relates to a lithographic apparatus and method.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 \lambda / NA_{PS} \quad (1)$$

where $\lambda$ is the wavelength of the radiation used, $NA_{PS}$ is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of k1.

In order to shorten the exposure wavelength, and thus reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving printing of small features. Such radiation is termed extreme ultraviolet or soft x-ray, and possible sources include, for example, laser-produced plasma sources, discharge plasma sources, or synchrotron radiation from electron storage rings.

EUV lithographic apparatus use mirrors to condition and direct EUV radiation. These mirrors may be susceptible to damage due to radiation outside of the EUV spectrum being absorbed by the mirrors rather than reflected.

SUMMARY

It is desirable to reduce the risk that a mirror of an EUV lithographic apparatus will be damaged by radiation which falls outside of the EUV spectrum.

According to a first aspect of the present invention there is provided a lithographic apparatus provided with a sensor, the sensor comprising a frame which defines a space that is crossed multiple times by wire, detection electronics being connected to the wire and being configured to detect a change of temperature of the wire due to infrared radiation being incident upon the wire, the detection electronics being further configured to provide an output signal in the event that a change of temperature of the wire is detected.

According to a second aspect of the present invention there is provided a lithographic method comprising exposing a substrate using radiation generated by a radiation source, using a sensor to detect the presence of infrared radiation in the lithographic apparatus, the sensor comprising a frame which defines a space crossed multiple times by wire and through which the radiation passes, detecting the infrared radiation via a change of temperature of the wire of the sensor, and switching off or blocking radiation from the radiation source when the infrared radiation is detected.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus according to the invention.

Figure 1:
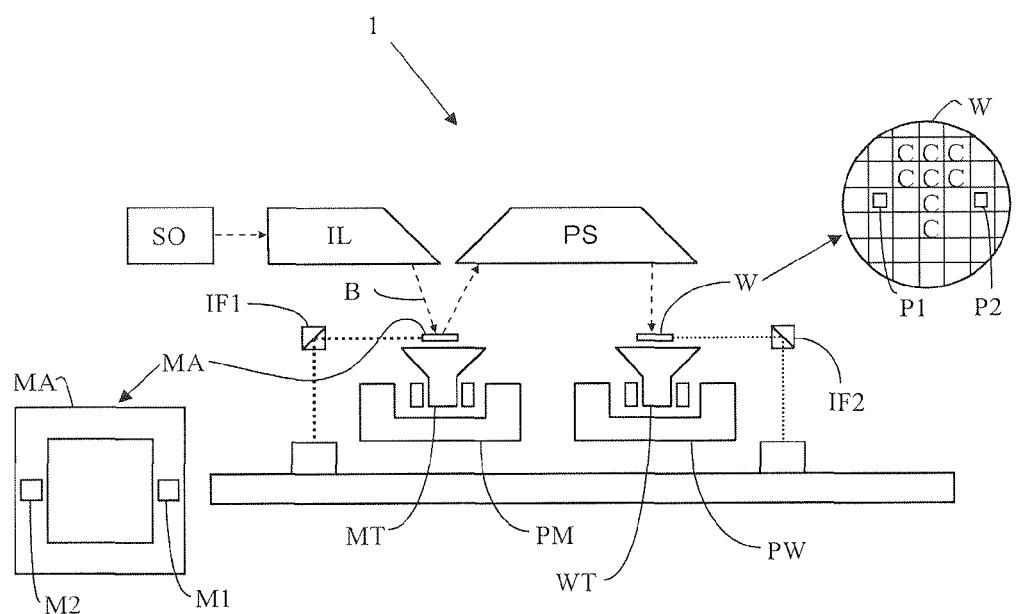

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus 1 according to an embodiment of the invention. The apparatus 1 comprises an illumination system IL (also referred to as an illuminator) configured to condition a radiation beam B (e.g., EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus 1, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically, in an EUV radiation lithographic apparatus, would be reflective. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The team "projection system" used herein should be broadly interpreted as encompassing any type of projection system. Usually, in an EUV radiation lithographic apparatus the optical elements will be reflective. However, other types of optical element may be used. The optical elements may be in a vacuum. Any use of the term "projection lens" herein may be considered as synonymous with the more general term "projection system".

As here depicted, the apparatus 1 is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illumination system IL receives a radiation beam from a radiation source SO. The source SO and the illumination system IL may together be referred to as a radiation system.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator and a condenser. The illumination system IL may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW, and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which foam part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 1 could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the plane of the substrate so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
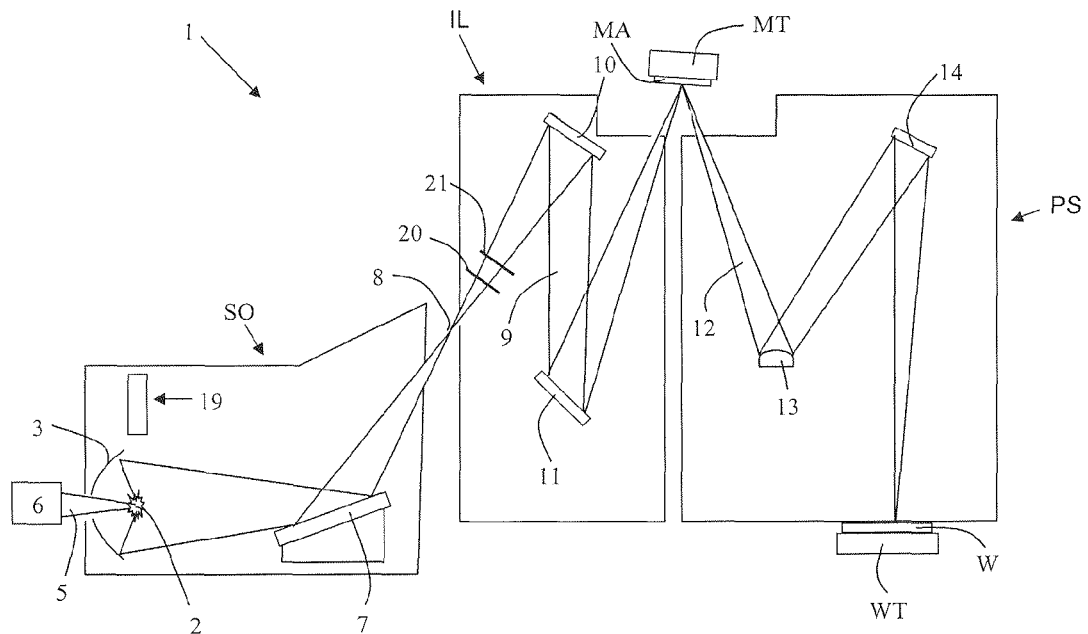
FIG. 2 is a more detailed but schematic illustration of the lithographic apparatus of FIG. 1.

FIG. 2 shows the lithographic apparatus 1 of FIG. 1 in more detail, but still in schematic form, including the radiation source SO, the illumination system IL, and the projection system PS. EUV radiation is produced by generating a plasma 2, which emits radiation in the EUV range of the electromagnetic spectrum. The plasma 2 may be created by using a laser beam 5 generated by a laser 6 to irradiate of a droplet of target material provided by a target material supply 19. The droplets of target material may for example be Xe, Li or Sn.

Radiation emitted by the plasma 2 is reflected by a collector mirror 3 which is configured to focus the radiation to a focal point, thereby forming a radiation beam. In this embodiment the focal point coincides with a so-called intermediate focus 8. In this embodiment, the radiation is focused to the focal point via a grazing incidence mirror 7. In other embodiments the grazing incidence mirror 7 may be omitted. The grazing incidence mirror 7 may be a grating spectral filter 7.

The radiation beam 9 is reflected in the illumination system IL via mirrors 10, 11 onto a patterning device MA (e.g., a reticle or mask) positioned on patterning device support MT (e.g., a reticle or mask table). A patterned beam 12 is formed which is imaged in the projection system PS via reflective elements 13, 14 onto a substrate W on the substrate table WT.

It will be appreciated that more or fewer elements than shown in FIG. 2 may generally be present in the radiation source SO, illumination system IL, and projection system PS.

Instead of or in addition to the grating spectral filter 7, a transmissive optical filter may be present in the lithographic apparatus, the transmissive optical filter being transmissive for EUV radiation and less transmissive for radiation at other wavelengths (e.g., substantially absorbing of radiation at other wavelengths). The transmissive optical filter may for example be a filter 20 which is configured to absorb infra-red (IR) radiation. The transmissive optical filter is hereafter referred to as IR filter 20.

A sensor 21 is provided in the lithographic apparatus, the sensor being configured to detect the presence of IR radiation. The sensor 21 is located downstream of the IR filter 20, and thus is arranged to detect IR radiation which is transmitted by the IR filter if the IR filter fails.

The IR filter 20 may for example comprise a grid that defines holes, which are dimensioned such that they transmit EUV radiation and do not transmit IR radiation. Alternatively, the IR filter 20 may for example comprise a zirconium-silicon foil, which does not transmit IR radiation. The IR filter 20 may for example block IR radiation which is produced by the plasma 2, and may also block the laser beam 5 which is used to generate the plasma (the laser beam may be an IR laser beam). The IR filter 20 may be susceptible to damage, since the zirconium-silicon wafer may be very thin. The sensor 21 is configured to detect IR radiation transmitted by the IR filter 20 when the IR filter has been damaged.

Figure 3:
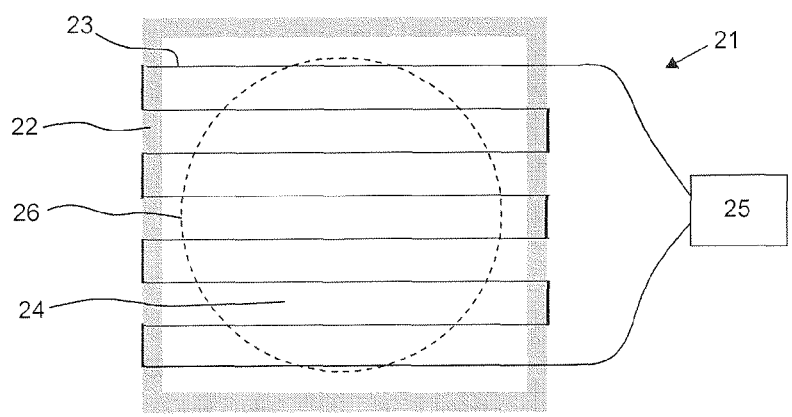
FIG. 3 shows a sensor which may foam part of the lithographic apparatus.

The sensor 21 is shown schematically viewed from one side in FIG. 3. The sensor comprises a frame 22, which holds a wire 23. In this embodiment the frame 22 is square. However the frame 22 may be rectangular, or may be any other suitable shape. The wire 23 passes a plurality of times through a space 24 defined by the frame 22. The wire 23 has a meandering route, which passes through the space 24 multiple times. The wire 23 starts close to an upper side of the frame 22, passes across the space 24, travels downwards along an outside edge of the frame, passes back across the space, passes downwards along an opposite outside edge of the frame, etc. In this way, the wire 23 crosses the space 24 multiple times, each crossing of the space being substantially equidistant from other crossings of the space. It is not essential that the crossings of the wire 23 across the space 24 are substantially equidistant from each other. The crossings may have unequal separations. The wire 23 is connected at either end to detection electronics 25, the operation of which is described further below.

A circle formed by a dotted line 26 shows schematically the EUV radiation beam, which is present in the lithographic apparatus during operation.

The wire 23 is a metal wire, and is formed from a metal which exhibits a variation of electrical resistance as a function of temperature. The metal may for example be nickel, chromium, steel, tungsten, aluminum, or some other suitable metal. The metal may for example have a variation of electrical resistance of at least 0.3% per degree centigrade of temperature. The metal may for example have a variation of electrical resistance of 0.5% or more per degree centigrade of temperature.

In use, the resistance of the wire 23 is monitored by the detection electronics 25, for example by applying a voltage across the wire and monitoring the current that passes through the wire. In the event that the IR filter 20 fails and a hole appears in the IR filter, IR radiation will be incident upon the wire 23. The IR radiation will be absorbed by the wire 23, thereby causing the wire to heat up. This will increase the resistance of the wire 23. The increased resistance of the wire will be detected by the detection electronics 25.

The detection electronics 25 is connected to the laser 6 that generates the laser beam 5 (see FIG. 2). The detection electronics 25 will switch off the laser 6 when the increased resistance of the wire 23 is detected. The detection electronics 25 may be connected directly to the laser 6, and may be configured to directly switch off the laser when IR is detected by the sensor 21. Alternatively, the detection electronics 25 may be connected indirectly to the laser 6, via for example other electronics. In some instances, the radiation beam 5 generated by the laser 6 may be blocked (e.g., by a shutter) rather than the laser 6 being switched off. In some instances, the radiation beam 5 generated by the laser 6 may be diverted (e.g., by a moveable mirror) away from the mirrors of the illuminator IL and/or projection system PS rather than the laser 6 being switched off.

The mirrors 10, 11, 13, 14 of the illumination system IL and the projection system PS comprise layers of material provided on substrates. The thicknesses of the layers of material are selected such that they provide high reflectivity for EUV radiation. However, the layers of material do not provide high reflectivity for IR radiation, and instead may absorb a significant proportion of IR radiation. The layers of material are susceptible to damage if they become too hot (e.g., the layers may diffuse into each other, leading to a reduced EUV-reflectivity). The intensity of IR radiation in the lithographic apparatus is such that the mirrors 10, 11, 13, 14 may be damaged by the IR radiation if the IR filter 20 fails.

As described above, the sensor 21, together with the detection electronics 25, is configured such that the laser 6 is switched off in the event that the IR filter fails. The sensor 21 and the detection electronics 25 are configured such that the laser is switched off, or the laser beam is prevented from reaching the mirrors 10, 11, 13, 14, before sufficient IR radiation has been incident upon the mirrors to damage them.

The speed with which the sensor 21 detects failure of the IR filter 20 depends upon the rate at which the resistance of the wire 23 changes when IR radiation is incident upon it. This in turn depends upon the thickness of the wire, and also upon the length of the wire. A thinner wire will heat up more quickly because it has a larger surface area relative to its mass. The wire may for example have a diameter of 0.1 mm.

Since the thermal mass of the wire 23 is much smaller than the thermal mass of the mirrors 10, 11, 13, 14, the wire will heat up much faster than the mirrors. The wire 23 can thus provide a timely indication of a failure of IR filter 20. This allows the laser 6 to be switched off (or the laser beam 5 to be blocked or diverted) before the mirrors 10, 11, 13, 14 are damaged.

The wire 23 blocks the EUV radiation beam (due to the fact that the wires do not transmit the EUV radiation). However, since the wire 23 is thin, the amount of EUV radiation, which is blocked by the wire, is small. For example, the wire 23 may block less than 1% of the EUV radiation. The amount of EUV radiation that is blocked by the wire 23 will increase if the diameter of the wire is increased, or if the separation between crossings of the opening is reduced (i.e., there are more crossings of the opening).

The length of the wire 23 influences the sensitivity of detection of IR radiation by the sensor 21, since it reduces the relative magnitude of a change of resistance of the wire compared with the absolute magnitude of the resistance of the wire. In FIG. 3, the wire 23 crosses the opening 24 defined by the frame 22 eight times. If the wire 23 were to cross the opening only six times or four times, then the wire would be shorter and would thus provide a more sensitive detection of IR radiation. However, spaces between the wire would be bigger, and there would be an increased risk that the IR filter would fail at a location, which was not detected by the wire 23. For example a small hole may appear in the IR filter 20, which is located such that IR radiation which passes through the hole passes through a space between crossings of the wire 23 across the space 24, and is thus not detected. It can be seen therefore that for this embodiment of the invention there may be a trade off between sensitivity of detection of IR radiation and the risk that a failure of the IR filter is not detected.

Figure 4:
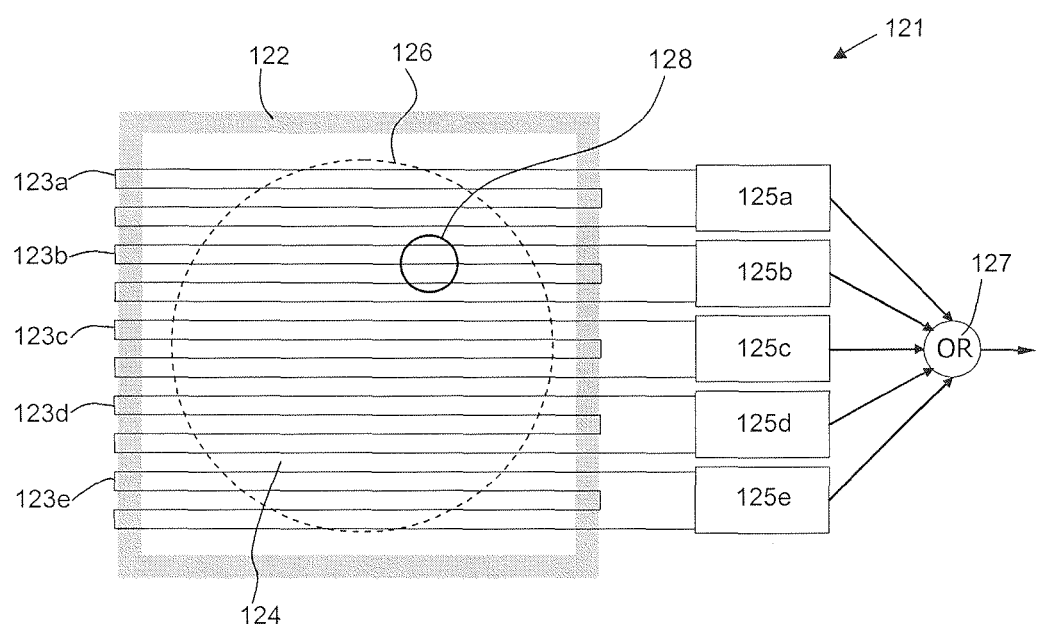
FIG. 4 shows an alternative sensor, which may form part of the lithographic apparatus.

FIG. 4 shows schematically viewed from one side a sensor 121 according to an alternative embodiment of the invention. The sensor 121 comprises a frame 122, which holds five wires 123a-e. Each wire 123a-e crosses four times through a space 124 defined by the frame 122. The wires 123a-e have meandering routes, and each wire passes through the space four times. Each wire 123a-e is connected at either end to detection electronics 125a-e. A circled formed by a dotted line 126 shows schematically the EUV radiation beam, which is present in the lithographic apparatus during operation.

In common with the embodiment shown in FIG. 3, the wires 123a-e are metal and are formed from a metal which exhibits a variation of electrical resistance as a function of temperature. The wires 123a-e may for example have the same properties as the wire described further above. Each wire 123a-e is connected at either end to detection electronics 125a-e. The detection electronics 125a-e are configured to output a signal to an OR gate 127 in the event that IR radiation is detected. The OR gate 127 is configured to provide an output signal if it receives a signal at one of its inputs. Thus, the OR gate 127 will be triggered if infrared radiation causes heating of one or more of the wires 123a-e. The OR gate 127 is connected to the laser 6 which generates the laser beam 5 (see FIG. 2) that is used to generate EUV radiation. The detection electronics 125a-e together with the OR gate 127 are configured to switch off the laser 6 in the event that infrared radiation is detected at one or more of the wires 123a-e.

In use, the lithographic apparatus is operated in the manner described further above, with infrared radiation being blocked by the IR filter 20, and EUV radiation passing through the IR filter 20 and the sensor 21. If a hole were to appear in the IR filter 20, then this would allow IR radiation to be incident upon the sensor 121. A circular region 128 is indicated as an example in FIG. 4, the circular region receiving IR radiation as the result of a failure of the IR filter 20. The IR radiation is incident upon the second wire 123b of the sensor 121, causing that wire to heat up. The second detection electronics 125b outputs a signal that passes to the OR gate 127. The OR gate 127 outputs a signal that causes the laser 6 to be switched off.

The embodiment of the invention shown in FIG. 4 allows shorter lengths of wire to be used in the sensor 121 (compared with the embodiment of FIG. 3), whilst at the same time providing the wires with a smaller separation within the frame 122. This provides increased sensitivity and also reduces the risk that a localized failure of the IR filter is not detected. Forming the sensor 121 from a plurality of wires allows the spatial resolution of the sensor to be improved without reducing the sensitivity of the sensor through the use of a longer wire.

Although each wire 123a-e crosses the space 124 four times in the embodiment shown in FIG. 4, each wire may cross the space any number of times (e.g., more than four times or less than four times).

In an embodiment, each wire crosses the space only one time. Where this is the case, detection electronics may be associated with each wire. Having each wire cross the space only one time provides the highest sensitivity (since the wire cannot be made any shorter). The spatial resolution provided by the sensor will depend upon the number of wires that are used. A higher number of wires will provide a higher spatial resolution. The cost of the sensor may be increased if the number of wires is increased (e.g., since more detection electronics may be needed).

In a further alternative arrangement (not illustrated) the wire 24,124 which crosses horizontally across the space 24,124 defined by the frame 22,122 is supplemented by wire which crosses the space vertically. The terms vertically and horizontally are used in this description to provide easy understanding of the embodiment of the invention. However, they should not be used to infer that the wires must have particular orientations. The wire(s) may cross the space 24, 124 defined by the frame in any suitable direction(s). The wire(s) may be transverse to one another, or may be non-transverse to one another.

The thinness of the wire(s) may be such that it will not generate shadow images at the mask MA or the substrate W.

It is desirable to provide a high intensity of EUV radiation at the substrate W, in order to expose target portions of the substrate quickly, and thereby provide a high throughput of wafers from the lithographic apparatus. For this reason it may be desirable to use wire with a small diameter (e.g., 0.3. mm or less, or 0.1 mm or less), since a small diameter wire will block less EUV radiation than a large diameter wire. Similarly, from a point of view of providing a lithographic apparatus with high throughput, it may be desirable to limit the number of times that the space 124 is crossed by the wire or wires. There may therefore be a trade off between providing a high density of wire or wires in the space 24, 124 in order to reduce the risk that a localised failure of the IR filter 20 is not detected, and reducing the density of the wire or wires in order to reduce the proportion of EUV radiation which is blocked by the wire or wires. The separation between crossings of the wire or wires across the space 24, 124 may be selected based upon properties of the IR filter 20 (e.g., the likely size of a hole that would be seen in the filter if the filter failed).

The detection electronics 25, 125a-e (and any other electronics) may be configured to switch off the laser 6 within one second of a failure of the IR filter 20 occurring, and in some instances within half a second of a failure of the IR filter occurring. This may be desirable in order to avoid the mirrors 10, 11, 13, 14 being damaged by the IR radiation. The first mirror 10 of the illumination system may be the most susceptible of the illumination system mirrors 10, 11 to damage by the IR radiation, since it will receive the highest intensity of IR radiation (some of the IR radiation will be absorbed by that mirror and so will not be incident upon the second mirror 11 of the illuminator). The mirrors 10,11 of the illumination system IL may be actively cooled, whereas it may be the case that the mirrors 13, 14 of the projection system PS are not actively cooled. The mirrors 13, 14 of the projection system PS may thus also be susceptible to damage, even though they will receive less IR radiation than the mirrors 10, 11 of the illumination system. The mirrors 13, 14 of the projection system may be more susceptible to damage than the mirrors 10, 11 of the illumination system.

The IR filter 20 absorbs IR radiation, and thus becomes hot during normal operation of lithographic apparatus. For this reason, the sensor 21 is not provided as part of the IR filter 20 (e.g., on a back face of the filter 20), but instead is provided on a separate frame 22, 122. The IR sensor 21 is spaced away from the IR filter 20, to avoid wires 23, 123a-e of the sensor being heated significantly by heat that radiates from the IR filter 20. Although some heat may radiate from the IR filter 20 to the sensor 21, 121 the amount of heat which is transferred is sufficiently low that it does not prevent operation of the sensor. In general, it may be desirable to locate the sensor 21 sufficiently far away from any sources of heat that it is not heated significantly by heat which radiates from those sources (i.e., such that operation of the sensor is not prevented).

Although the IR filter 20 is shown as being located in the illuminator IL, the IR filter may be provided at any suitable location in the lithographic apparatus, including in the source SO. The IR filter 20 could take any suitable form, and need not necessarily be a transmissive filter. The collector 3 may itself be the IR filter.

Although the sensor 21 is shown as being before the first mirror 10 of the illuminator IL, the sensor may be provided at any suitable location. For example, the sensor 21 may be provided in the source SO. The sensor 21 may for example be provided after the first mirror 10 of the illuminator. When this is done, the sensitivity with which the sensor detects IR radiation may be reduced, since the first mirror 10 may absorb a significant proportion of the IR radiation that is incident upon it. Nevertheless, the sensitivity of the IR sensor 21 may be sufficiently high that it can detect IR radiation and switch off the laser before the mirrors 10, 11, 13, 14 are damaged by the IR radiation.

The sensor 21, 121 is shown in FIG. 2 as being relatively close to the intermediate focus 8 (the sensor is closer to the intermediate focus than it is to the first mirror 10). The sensor may be located closer to the first mirror 10. However, if this were to be done, it would need to sense over a larger area because the radiation beam expands as it gets closer to the first mirror 10. This would require a longer wire(s) in the sensor 21, since the space defined by the frame 22, 122 would be increased.

The illuminator IL may be held at a vacuum. The frame 22, 122, together with a sensing portion of the wire or wires 23, 123a-e, may be located within the vacuum in the illuminator IL. They may be formed from materials that have a low out-gassing coefficient compared with the detection electronics. The detection electronics 25, 125a-e may be located outside of the vacuum of the illuminator IL. The detection electronics may thus be constructed from materials that provide significant amounts of out-gassing without contaminating the vacuum in the illuminator IL. A non-sensing portion of the wire or wires 23, 123a-e may pass from the vacuum to the detection electronics. In an alternative arrangement, the detection electronics may be sealed in a box, which may be located in the vacuum of the illuminator IL. The box may be formed from a material having a low out gassing coefficient.

As mentioned above, the wires 23, 123a-e may be formed from metal. However, the wires may be formed from material other than metal. For example, the wires may be formed from a semiconductor such as silicon carbide. Metal wires give rise to less outgassing compared with for example semiconductor wires, and are therefore more suited to use in a vacuum environment.

The sensor 21, 121 may be used to monitor for the presence of IR radiation in an apparatus in which IR radiation is not normally present or is normally present with a relatively low intensity (e.g., an apparatus in which no IR filter is present). The apparatus may for example generate radiation which is outside of the IR spectrum during normal operation, but may generate IR radiation if it is not operating correctly. The sensor 21, 121 may be used to detect the IR radiation in this circumstance. The apparatus may be a lithographic apparatus.

The source SO described above in relation to the figures is a laser produced plasma (LPP) source. In an alternative embodiment of the invention, the source SO is a discharge produced plasma (DPP) source. The detection electronics (and any other electronics) may be configured to switch off the DPP source, or block or divert the radiation beam, in the event that IR radiation is detected. The detection electronics may be configured to switch off any source of IR radiation, or block or divert the IR radiation, in the event that IR radiation is detected.

The lithographic apparatus in which the sensor is provided may for example comprise an illumination system configured to condition a radiation beam, a support structure constructed to hold a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

Although specific reference may be made in this text to the use of lithographic apparatus in the manufacture of integrated circuits, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

Where the context allows, the terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm).

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A lithographic apparatus provided with a sensor, the sensor comprising:
    a frame which defines a space that is crossed multiple times by a wire; and
    detection electronics connected to the wire and configured to detect a change of temperature of the wire due to infrared radiation being incident upon the wire, the detection electronics are connected to a source of infrared radiation, and are configured to switch off the source or block or divert infrared radiation generated by the source in response to the infrared radiation being detected by the sensor.

2. The lithographic apparatus of claim 1, wherein the sensor and the detection electronics are configured to switch off the source, block or divert infrared radiation generated by the source sufficiently quickly that mirrors of the lithographic apparatus are not damaged by the infrared radiation.

3. The lithographic apparatus of claim 1, wherein the detection electronics are configured to switch off the source, block or divert infrared radiation generated by the source within 1 second of infrared radiation being detected by the sensor.

4. The lithographic apparatus of claim 1, wherein the sensor is located downstream of an infrared filter.

5. The lithographic apparatus of claim 1, wherein the frame and a sensing portion of the wire is located within a vacuum, and the detection electronics are located outside of the vacuum.

6. The lithographic apparatus of claim 1, wherein the frame and a sensing portion of the wire is located within a vacuum, and the detection electronics are sealed in a box inside the vacuum.

7. The lithographic apparatus of claim 1, wherein the wire has a diameter of about 0.3 mm or less.

8. The lithographic apparatus of claim 1, wherein the wire has a diameter of about 0.1 mm or less.

9. The lithographic apparatus of claim 1, wherein the wire is metal.

10. The lithographic apparatus of claim 1, wherein the wire is a single wire which crosses the space defined by the frame multiple times.

11. The lithographic apparatus of claim 1, wherein the wire comprises a plurality of wires that cross the space defined by the frame multiple times.

12. The lithographic apparatus of claim 1, wherein the wire comprises a plurality of wires that cross the space defined by the frame only once.

13. A lithographic method comprising:
exposing a substrate using radiation generated by a radiation source;
detecting presence of infrared radiation in a lithographic apparatus using a sensor comprising a frame which defines a space crossed multiple times by a wire and through which the radiation passes, wherein the detecting comprises detecting the infrared radiation via a change of temperature of the wire; and
switching off, blocking or diverting the radiation from the radiation source in response to the infrared radiation being detected.

* * * * *